United States Patent [19]

Huang

[11] Patent Number: 5,596,215

[45] Date of Patent: Jan. 21, 1997

[54] METHOD TO IMPROVE BURIED CONTACT RESISTANCE

[75] Inventor: Jenn M. Huang, Hsin-Chu, Taiwan

[73] Assignee: Taiwan Semiconductor Manufacturing Company, Hsin-Chu, Taiwan

[21] Appl. No.: 620,183

[22] Filed: Mar. 22, 1996

Related U.S. Application Data

[62] Division of Ser. No. 488,764, Jun. 8, 1995, Pat. No. 5,525,552.

[51] Int. Cl.$^6$ .................... H01L 29/76; H01L 29/94; H01L 27/088

[52] U.S. Cl. .................... 257/344; 257/382; 257/900

[58] Field of Search .................... 257/344, 408, 257/382, 383, 385, 754, 755, 756, 900

[56] References Cited

U.S. PATENT DOCUMENTS

| | | | |
|---|---|---|---|
| 4,341,009 | 7/1982 | Bartholomew et al. | 437/31 |
| 5,315,150 | 5/1994 | Furuhata | 257/382 |
| 5,320,972 | 6/1994 | Wylie | 437/31 |
| 5,381,040 | 1/1995 | Sun et al. | 257/774 |

*Primary Examiner*—Wael Fahmy
*Attorney, Agent, or Firm*—George O. Saile

[57] ABSTRACT

A process for fabricating MOSFET devices, using an optimized buried contact approach, for source and drain contacts, has been developed. This process is forgiving for non-optimized photolithographic alignments, which when used as masks for dry etching, can result in the creation of trenches or crevices in the device region, ultimately degrading the conductive path from the buried contact region, to a polysilicon contact structure. Films used to create the spacer sidewalls on polysilicon gate structures, also fill the unwanted trench or crevice. Therefore materials are chosen, that have electrical charge characteristics of gate fringing field effects, that will result in the creation of a more conductive accumulation layer, for the contact path.

4 Claims, 6 Drawing Sheets

5,596,215

1

METHOD TO IMPROVE BURIED CONTACT RESISTANCE

This application is a divisional of 08/488,764, filed Jun. 8, 1995, now U.S. Pat. No. 5,525,552.

BACKGROUND OF THE INVENTION

1. Field of the Invention

The present invention relates to a fabrication method used for semiconductor devices, and more specifically to an improved process for metal oxide semiconductor field effect transistor, (MOSFET), structures, via use of a buried contact feature.

2. Description of Prior Art

The ability of the semiconductor industry to continually reduce the cost of semiconductor chips, while still maintaining, or improving device performance, is directly related to the ability of the industry to fabricate smaller and denser chips. For example micro-miniaturization has allowed specific semiconductor elements to be packed more densely on a chip, thus decreasing specific resistances, resulting in performance enhancements. In addition the trend to, micro-miniaturization has resulted in smaller semiconductor images, allowing more circuits per chip to be realized, thus resulting in cost reductions. The major advances in the semiconductor industry, responsible for micro-miniaturization, has been the breakthroughs it, the photolithographic and reactive ion etching, (RIE), disciplines. More sophisticated exposure cameras, as well as the development of more sensitive photoresist materials, have resulted in sub-micron images, in photoresist, to be routinely achieved. The advances in RIE tools, as well as the development of specific RIE ambients, have allowed the successful transfer of sub-micron images in photoresist, to underlying materials, used in the semiconductor fabrication process.

In addition to the advances in specific semiconductor disciplines, the development of specific process sequences, has also contributed to the increases in chip density. For example the invention of the sidewall technology, used extensively in complimentary metal oxide semiconductor, (CMOS), devices, has had a positive impact on device density. Another process sequence, used to decrease chip size, has been the buried contact process. For example in CMOS devices, the contact to source and drain regions, if made in the active device region, would require large silicon areas, thus negatively impacting density. Therefore processes and structures were developed, in which contact to these source and drain regions, could be made through a polysilicon structure. Therefore access to the source and drain region can be made by contacting the polysilicon layer, in a non-critical device area. The polysilicon layer in turn, contacts the the source and drain regions, via a process known as the buried contact scheme. In U.S. Pat. No. 4,341,009, Bartholomew, et al, describe a specific buried contact process, used for the fabrication of MOSFETs. However that process is complex, requiring a significant increase in process steps, and thus compromising the density benefits, with cost increases. The invention now described, will show a simpler, more cost effective process for achieving the buried contact scheme.

SUMMARY OF THE INVENTION

It is an object of this invention to provide a method of making contact to active regions in a semiconductor substrate via a polysilicon connection.

2

It is another object of this invention to provide a conductive link between the polysilicon connection and the active region in the semiconductor substrate.

It is yet another object of this invention to decrease the resistance of the link between the polysilicon connection and the active regions in the semiconductor substrate, by using specific sidewall spacer insulators, with specific charge characteristics, that will influence the underlying silicon, in a manner that results in a less resistive path.

In accordance with the present invention a method is described for fabricating MOSFET devices, using an improved buried contact process. After formation of field oxide regions, a thin gate oxide is grown, followed by deposition of a thin layer of first polysilicon. An opening, to the underlying substrate, is made in the finest polysilicon —gate oxide layers, followed by the creation of a doped region in the opening to the substrate. A second deposition, of a thicker layer of polysilicon is then performed, followed by ion implantation, or a conventional furnace diffusion procedure, used to dope the composite polysilicon layers. Patterning is then used to form a polysilicon gate structure, in the active device region, and to form another polysilicon structure, partially overlying the previously formed, active doped region, as well as partially overlying a field oxide region. Thermal oxidation is used to create a thin oxide on the sidewall of the polysilicon gate structure. Ion implantation procedures are employed to create the source and drain regions, in the active device region, also resulting in link-up to the doped region in the substrate. Thicker sidewall spacers are formed, via deposition of specific sidewall spacer materials, followed by anisotropic reactive ion etching. The spacers are formed on the sidewalls of both polysilicon structures. In addition any trench or crevice, formed during the RIE sidewall procedure, in the region adjacent to the polysilicon structure that overlays the doped region, is also filled with the spacer material. Ultimately contact to the polysilicon layer, overlying the field oxide region, results in contact to the source and drain regions, via the doped region, buried contact, in the substrate.

BRIEF DESCRIPTION OF THE DRAWINGS

The object and other advantages of this invention are best described in the preferred embodiment with reference to the attached drawings hat include.

DESCRIPTION OF THE PREFERRED EMBODIMENTS

The method of forming MOSFETs, with an improved buried contact process, will now be covered in detail. This process can be used as part of MOSFET devices that are now being manufactured in industry, therefore only the specific areas unique to understanding this invention will be described in detail.

Figure 1:
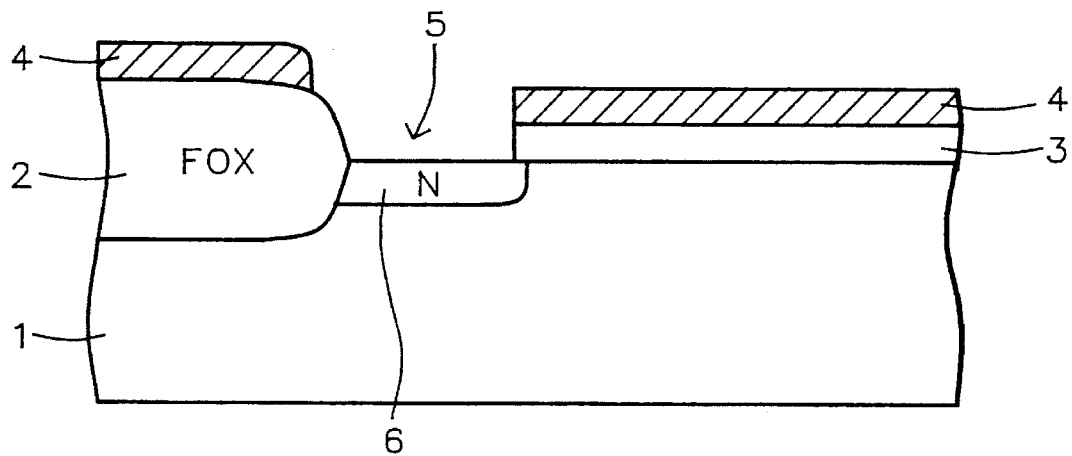
FIG. 1–6, which schematically illustrate, in cross-sectional representation, the fabrication sequence used to achieve MOSFET structures, using a buried contact process, without crevice formation FIG. 7–9, which schematically show an identical fabrication sequence, however with a crevice formation in the substrate, occurring due to poor photo lithographic alignment. Also shown is an insulator spacer solution for the crevice phenomena.
Figure 2:
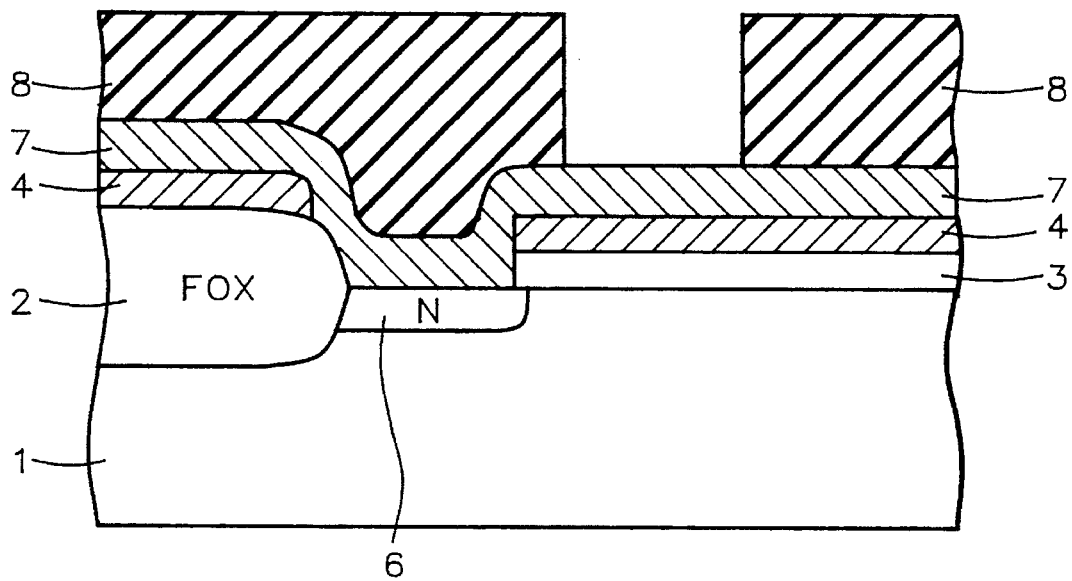

A substrate, 1, composed of P type, single crystal silicon with a <100> orientation, is used. A thick field oxide, 2, (FOX), is formed surrounding the region where the device is to be built. This is shown schematically in FIG. 1. Briefly the method used to form the FOX insulator is to use a thin thermal oxide, and a silicon nitride layer, as an oxidation mask. The desired FOX regions are etched opened in the silicon nitride—silicon dioxide mask using conventional photolithographic, and dry etching techniques. After removal of the masking photoresist, followed by chemical cleans, a field oxide is grown, typically to a thickness of between about 4000 to 6000 Angstroms. After removal of the oxidation mask via wet processes, such as, hot phosphoric acid for the silicon nitride layer, and a buffered hydrofluoric acid solution, for the silicon dioxide film,. a gate oxide, 3, is grown in an oxygen—steam ambient, at a temperature between about 750° to 1000° C., to a thickness between about 50 to 300 Angstroms. Next a thin layer of polysilicon, 4, is grown using low pressure chemical vapor deposition, (LPCVD), at a temperature between about 450° to 650° C., to a thickness between about 250 to 1000 Angstroms. Standard photolithographic, and RIE processing, using SF6 or Cl2, for the polysilicon, and CF4+CHF3, for the silicon dioxide, are employed to open contact hole, 5, to the substrate Doping of the substrate, through opening, 5, is made using ion implantation of arsenic, at an energy between about 20 to 70 Kev., at a dose between about 5E14 to 3E15 atoms/cm2. The doping of this region can also be accomplished via conventional POCl3 processing, either process resulting in the formation a buried contact region, 6, schematically shown in FIG. 1.

Figure 3:
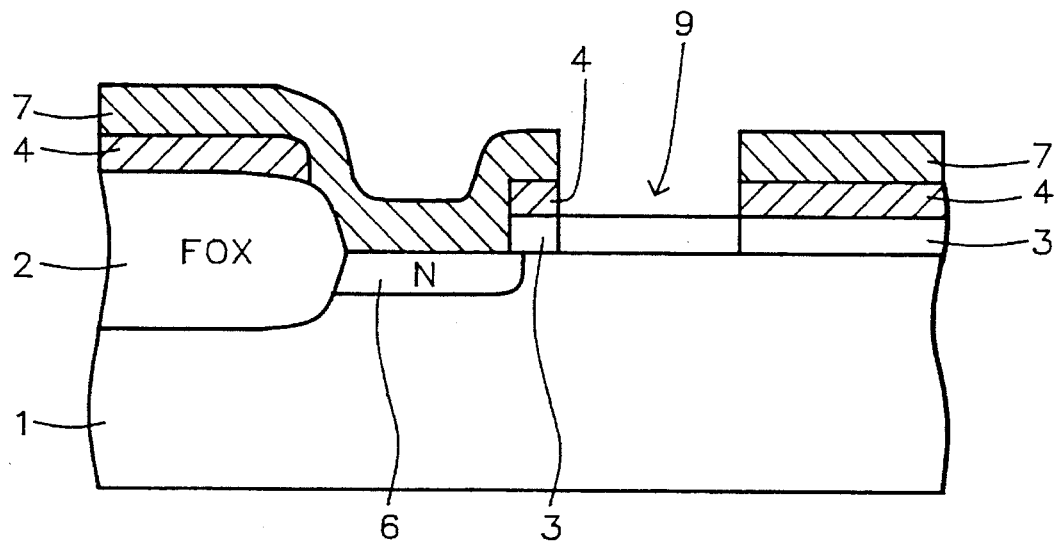
Figure 8:
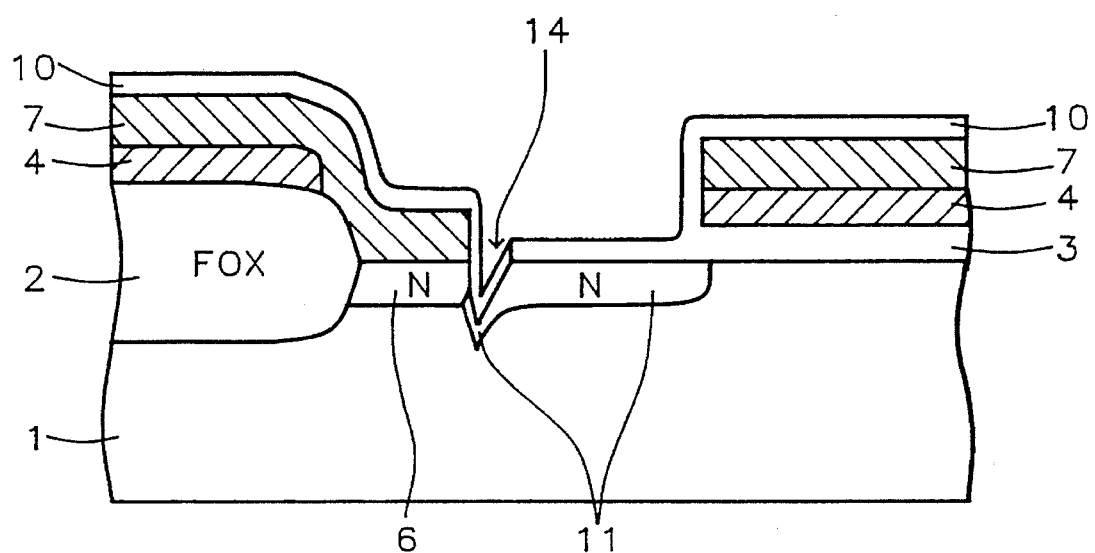

A second layer of polysilicon, 7, is then deposited, again via LPCVD processing, to a thickness between about 1000 to 4000 Angstroms. A critical photolithographic alignment step is now performed to establish the polysilicon gate structure, as well as another polysilicon structure, that will eventually supply a link-up to a subsequent source and drain region, via the buried contact, 6. It is important that the edge of the masking photoresist shape, 8, lie close to the edge of the first polysilicon-gate oxide layers, to avoid subsequent link-up problems. However it is also critical that the photoresist shape, 8, does not miss the underlying first polysilicon-gate oxide layers, since subsequent RIE processing will create a crevice in the missed overlay area. This is shown in FIG. 8. The result of a properly aligned photolithographic process is shown in FIG. 3. The RIE processing was carried out using Cl2+HBr +CHF3 for the polysilicon composite layer. Photoresist removal was accomplished using conventional O2 ashing plasma procedures. It can be seen in FIG. 3, that the entire etching was performed over the second polysilicon layer, and the first polysilicon-gate oxide layer, creating a non-creviced opening, 9, in the substrate. It can also be seen from this illustration that only a minimum of overlay, between the second polysilicon and the first polysilicon-gate oxide, was achieved, thus minimizing eventual link-up problems.

Figure 4:
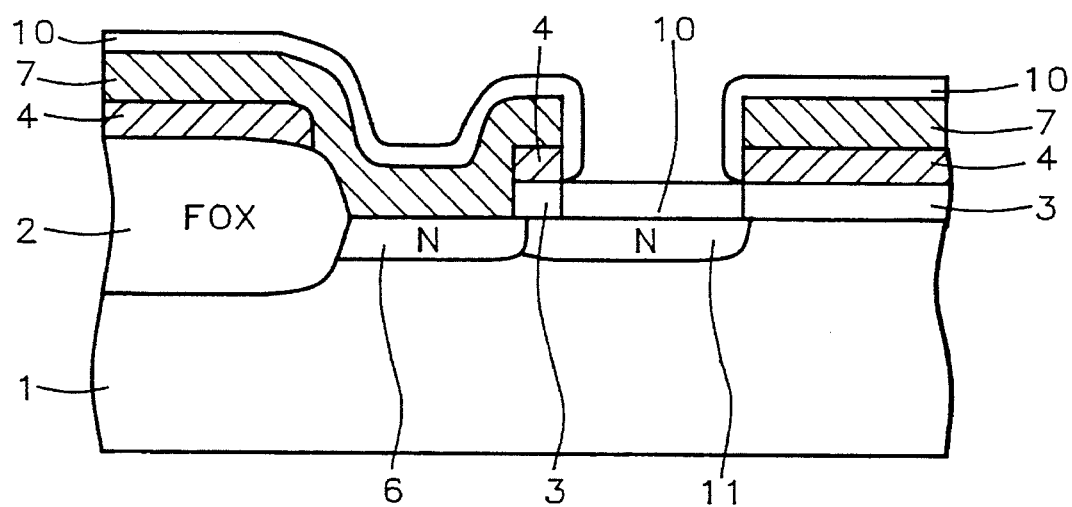

The fabrication sequence continues with a thermal oxidation, of the exposed polysilicon and exposed substrate, performed at a temperature between about 800° to 950° C., to a thickness between about 50 to 850 Angstroms. The resulting silicon dioxide layer, 10, is shown in FIG. 4. An ion implantation is now performed using arsenic, at an energy between about 20 to 100 Kev., at a dose between about 1E13 to 1E14 atoms/cm2, for purposes of creating the lightly doped source and drain, (LDD), regions, 11. It can be seen in FIG. 4, that with subsequent heat treatments regions 6, and 11, will link-up.

Figure 5:
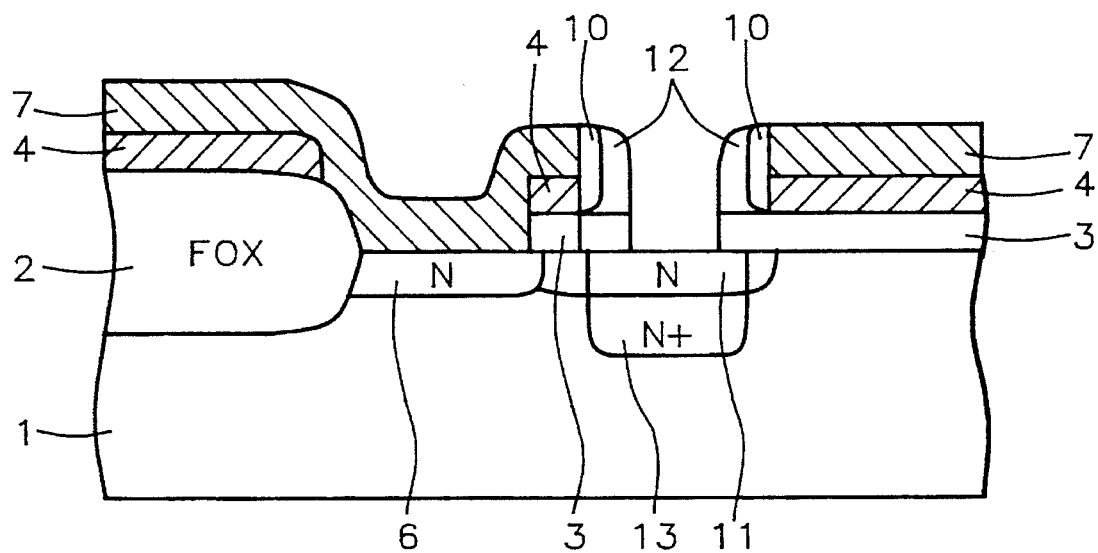

The MOSFET is completed by creating a sidewall spacer and then forming the source and drain regions. This is shown schematically in FIG. 5. The material chosen for the spacer can be polysilicon, silicon nitride or tantalum oxide. The choice of these specific materials is based on the fact that positive charges, characteristic of gate fringing electrical field effects, will cause the underlying silicon surfaces to be in accumulation, or to make the underlying silicon more N type. This will improve the link-up between the buried contact, 6, and the source and drain regions. This will become even more essential when crevices in the silicon are formed, due to photolithographic alignment errors. The silicon nitride layer is obtained via LPCVD processing, at a temperature between about 750° to 850° C., to a thickness between about 1000 to 3000 Angstroms. The silicon nitride spacer, 12, is created by anisotropic RIE, using CF4 +CHF3. If a tantalum oxide is used for the spacer, the deposition is performed using r.f. sputtering or chemical vapor deposition techniques, again to a thickness between about 1000 to 3000 Angstroms. The anisotropic RIE procedure, used to create the sidewall spacer, 12, is obtained using a fluorine or chlorine chemistry. The source and drain regions, 13, are formed via ion implantation of arsenic, at an energy between about 20 to 100 Kev., at a dose between about 1E15 to 5E15 atoms/cm2. An activation anneal, using either rapid thermal annealing, (RTA), or via a conventional furnace process, is performed at temperature between about 800° to 1000° C. This procedure allows the link-up of polysilicon to the source and drains, 13, through the buried contact, 6.

Figure 6:
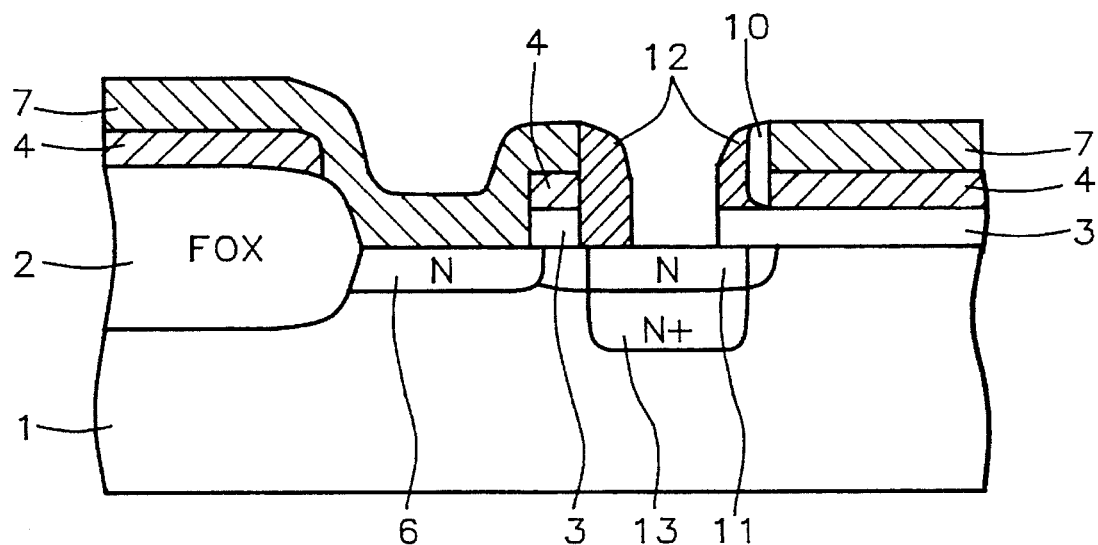

The polysilicon version of the spacer, shown in FIG. 6, consists of initially removing oxide layer, 10, from the sides of the buried contact structure, via a photolithographic block-out of the polysilicon gate region, and a buffered hydrofluoric acid treatment, followed by a LPCVD process at a temperature between about 450° to 750° C., to a thickness between about 1000 to 3000 Angstroms. The anisotropic RIE process, carried out in a Cl2 chemistry, again produces sidewall, 18, which for this case is indistinguishable from the polysilicon structures it lies on. Source and drain implants, and anneal cycles, identical to processes described previously for FIG. 5, complete the fabrication sequence.

Figure 7:
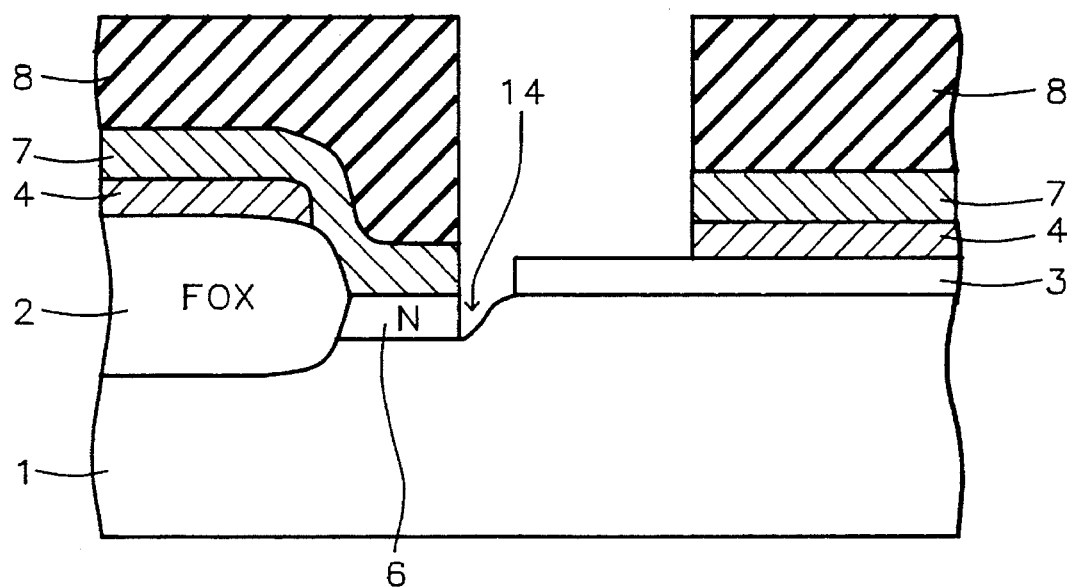

The choice of the specific spacer material will now become evident. FIG. 7, again shows the photolithographic procedure used to define the needed polysilicon structures. However in this case perfect alignment did not occur, and therefore the RIE process used, created crevice, 14. This occurs due to RIE procedure removing polysilicon layer 7, in specific areas, while in other areas the absence of thin oxide, 3, results in the crevice formation. FIG. 8, indicates the resist removal step, followed by an ion implantation procedure, used to form the LDD region, 11, identical in processing conditions to conditions previously described for FIG. 4. However it can be seen that the directional ion implantation, in combination with crevice, 14, did not allow sufficient link-up to the buried contact region, 6.

Figure 9:
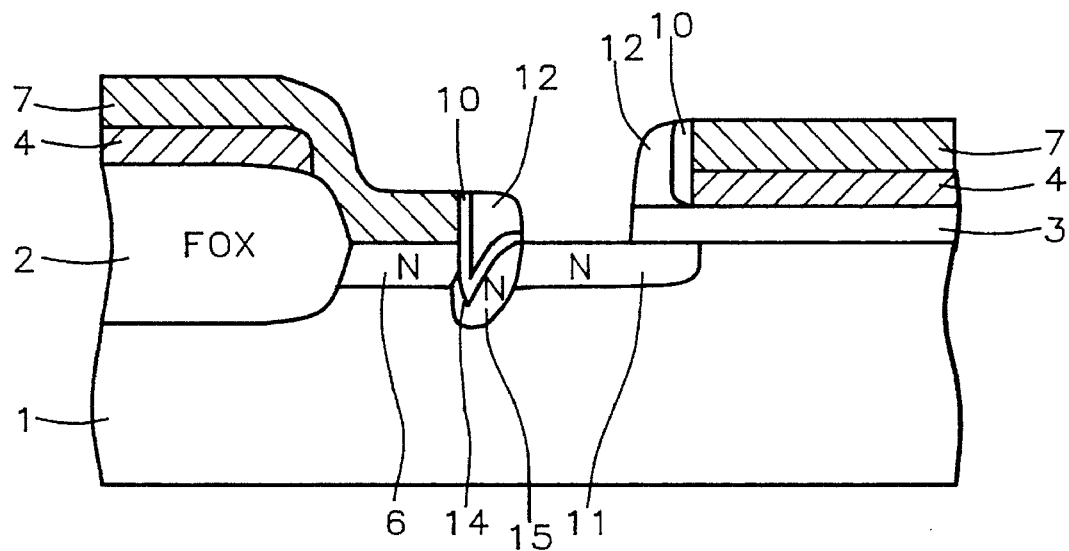

A spacer deposition, previously described, of silicon nitride, or tantalum oxide, followed by RIE procedures, also previously described, result in spacer layer, 12, on the exposed polysilicon sidewalls, in addition to filling crevice, 14. The positive charge, characteristic of gate fringing electrical field effects, in these insulator films, induces an accumulation effect in the creviced silicon, resulting in a more conductive link, 15, between the buried contact, 6, and the source and drain region. This is shown in FIG. 9.

Figure 10:
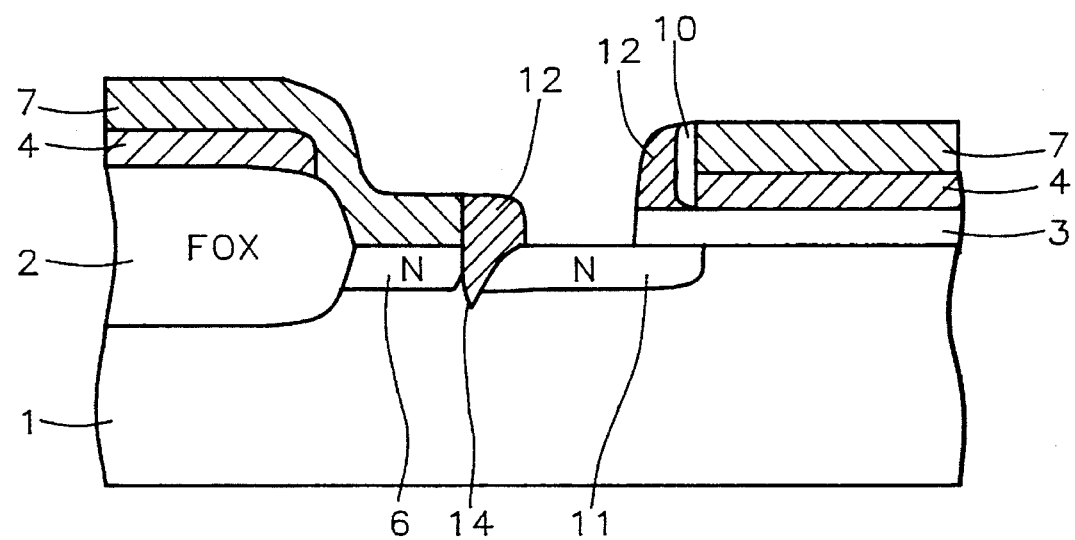
FIG. 10–11, schematically show a polysilicon spacer solution for the crevice phenomena.
Figure 11:
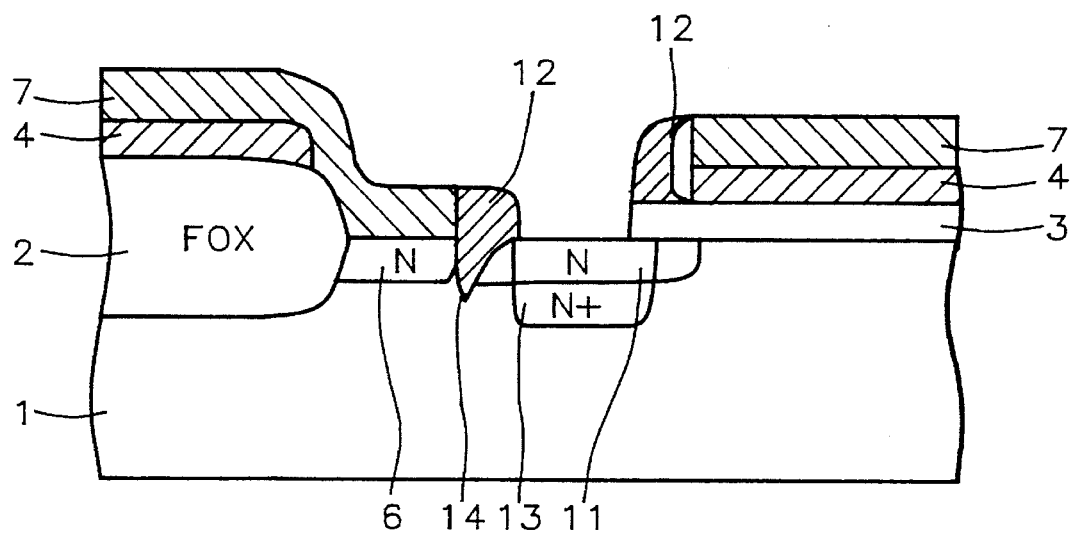

Another embodiment is again the removal of oxide layer, 10, via a photolithographic block-out of the polysilicon gate structure, and a buffered hydrofluoric acid step, followed by a polysilicon deposition and RIE, used to create a polysilicon spacer, 18. The deposition and RIE procedures are identical to procedures previously described. In this case the polysilicon fills crevice, 14. This is shown in FIG. 10. After source and drain processing, and activation annealing, again identical to previously described procedures, the crevice is now filled with a N type doped, polysilicon, 12, thus providing a conductive path for link-up of the various regions. This is shown in FIG. 11.

Figure 12:
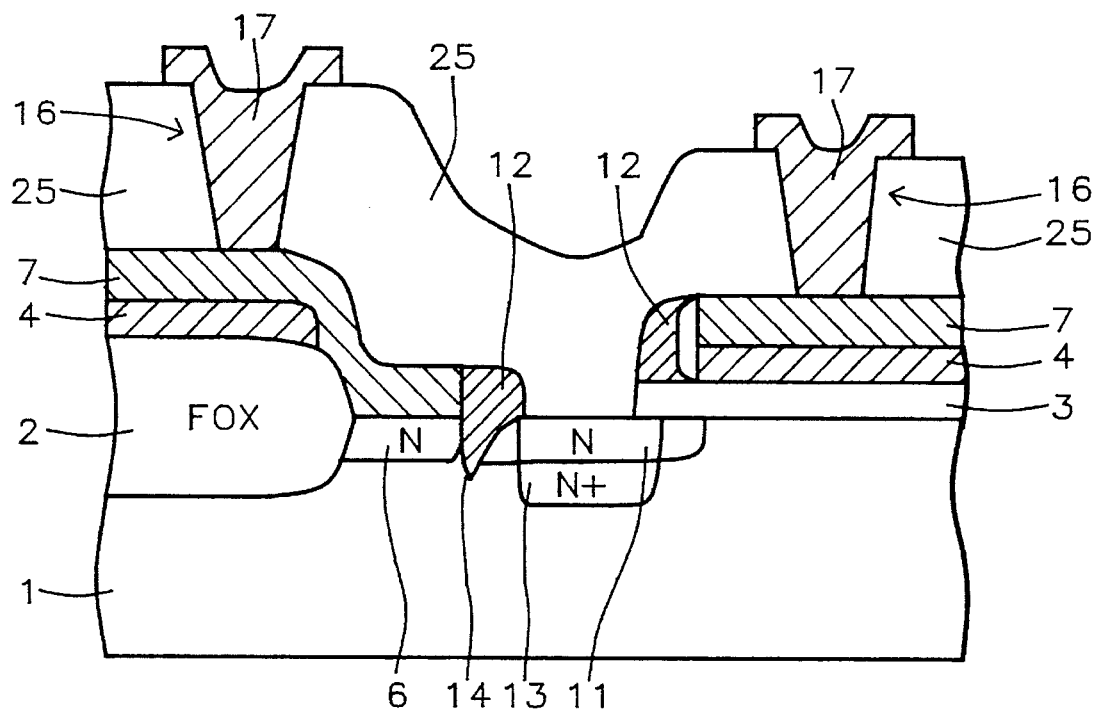
FIG. 12, schematically illustrating, in cross-sectional representation, a metallized MOSFET, fabricated using a buried contact process.

Finally a boro-phospho-silicate glass, (BPSG), layer, 15, is deposited, using atmospheric pressure chemical vapor deposition, (APCVD), processing, to a thickness between about 5000 to 18000 Angstroms. A reflow process is used to obtain an even topology, followed by conventional photolithographic and RIE procedures, used to form metal structure 16, used as a contact to both the polysilicon gate structure, as well as to the polysilicon structure that in turn is used as the contact to the source and drain region. Metallization, such as Al-Cu, or Al-Cu-Si, is deposited to a thickness between about 3000 to 10000 Angstroms. Patterning using photolithographic and RIE procedures result in metal contacts, 17. FIG. 12, indicates the conductive path from metal contact, 17, to the source and drain regions, via the improved buried contact region.

This process, for an improved buried contact, can be applied to P type, (PFET), devices, as well as to complimentary, (CMOS), structures. In addition BiCMOS, (bipolar-CMOS), devices can also be fabricated using this invention.

While this invention has been particularly shown and described with reference to, the preferred embodiments thereof, it will be understood by those skilled in the art that various changes in form and details may be made without departing from the spirit and scope of this invention.

What is claimed is:

1. A MOSFET device structure, comprising:

a field oxide region on the surface of a semiconductor substrate;

a device area in an area of said semiconductor substrate, not covered by said field oxide region;

a polysilicon gate structure having a sidewall overlying a first region, of said device area;

a polysilicon contact structure having a sidewall overlying said field oxide region, and extending to overlay a second region of, said device area;

a doped region, used for buried contact, in said second region, of said device area, underlying said polysilicon contact structure;

a creviced, third region in said device area, adjacent to the sidewall of said polysilicon contact structure;

a slightly doped source and drain region in a fourth region, of said device area, with said fourth region of said device area including said creviced, third region, of said device area, and located between said polysilicon gate structure, and said polysilicon contact structure;

a spacer located on the sidewall of said polysilicon gate structure, and on the sidewall of said polysilicon contact structure, with said spacer completely overlying said creviced, third region, of said device area;

a heavily doped source and drain region located in a fifth region, of said device area, located between said spacer on sidewall of said polysilicon contact structure, and said spacer on sidewall of said polysilicon gate structure; and metal contact structures to said polysilicon contact structure, and to said polysilicon gate structure.

2. The MOSFET device structure of claim 1, wherein said spacer, overlying said creviced, third region, of said device area, is comprised of polysilicon, at a thickness between about 1000 to 3000 Angstroms.

3. The MOSFET device structure of claim 1, wherein said spacer, overlying said creviced, third region, of said device area, is comprised of silicon nitride, at a thickness between about 1000 to 3000 Angstroms.

4. The MOSFET device structure of claim 1, wherein said spacer, overlying said creviced, third region, of said device area, is comprised of tantalum oxide, at a thickness between about 1000 to 3000 Angstroms.

* * * * *